(12) United States Patent
Briskin et al.

(10) Patent No.: US 7,292,084 B2
(45) Date of Patent: Nov. 6, 2007

(54) TIMER CIRCUIT WITH ADAPTIVE REFERENCE

(75) Inventors: Boris Briskin, Ankeny, IA (US); William Andrew Burkland, Huxley, IA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 11/457,284

(22) Filed: Jul. 13, 2006

(65) Prior Publication Data

US 2006/0244545 A1    Nov. 2, 2006

Related U.S. Application Data

(62) Division of application No. 10/968,701, filed on Oct. 18, 2004, now Pat. No. 7,138,843.

(51) Int. Cl.
*H03H 11/26*    (2006.01)
(52) U.S. Cl. .................. 327/261; 368/107; 368/108
(58) Field of Classification Search ............... 327/261; 368/107, 108
See application file for complete search history.

(56) References Cited

U.S. PATENT DOCUMENTS

| 5,780,904 | A | 7/1998 | Konishi et al. |
| 5,910,739 | A | 6/1999 | Stanojevic |
| 6,147,825 | A | 11/2000 | Alini et al. |
| 6,795,286 | B2 | 9/2004 | Maloney et al. |
| 6,968,167 | B1 * | 11/2005 | Wu et al. ............... 455/251.1 |

* cited by examiner

*Primary Examiner*—Kenneth B. Wells
(74) *Attorney, Agent, or Firm*—Patent Law Group LLP; Carmen C. Cook

(57) ABSTRACT

A timer circuit includes a current mirror, a capacitor, a first switch, a resistor and a comparator. The current mirror receives a reference current and provides first and second currents with a predefined current ratio. The capacitor receives the first current as a sinking current or as a sourcing current. The first switch, controlled by a control signal, allows the capacitor to be charged by the first current or be discharged. The resistor is biased by the second current to provide an adaptive reference voltage. The comparator compares the voltage across the capacitor and the adaptive reference voltage and triggers an output signal when the capacitor voltage is increased to the adaptive reference voltage.

18 Claims, 4 Drawing Sheets

TIMER CIRCUIT WITH ADAPTIVE REFERENCE

CROSS REFERENCE TO RELATED APPLICATION

This application is a divisional of application Ser. No. 10/968,701, filed Oct. 18, 2004, entitled "Timer Circuit With Adaptive Reference" of the same inventors hereof, now U.S. Pat. No. 7,138,843, issue on Nov. 21, 2006, which application is incorporated herein by reference in its entirety.

FIELD OF THE INVENTION

The invention relates to timer circuits and, in particular, to a timer circuit using an adaptive reference to provide a highly accurate delay time.

DESCRIPTION OF THE RELATED ART

Electrical circuits often require precise time durations. Analog timer circuits, typically integrated with the electrical circuits in an integrated circuit, are used to provide such precision timing functions. In many applications, accurate time durations are critical to the operation of the electrical circuits.

Many conventional timer circuits exploit the charging or discharging time constant of a capacitor to implement the required timing function. Typically, a reference current is used to charge or discharge a capacitor and the voltage across the capacitor is compared against a reference voltage. When the capacitor charges to or discharges below a given reference voltage, the output signal of the timer circuit is then triggered.

One of the major shortcomings of the conventional capacitive timer circuits is a large variation in the timing durations generated by the circuits. The main cause of the problem is variations in the magnitude of the reference current used to charge or discharge the capacitor due to process conditions, operating temperatures and other factors. U.S. Pat. No. 5,780,904 to Konishi et al. describes generating an extremely small constant current with high accuracy for charging a capacitor in a timer circuit. U.S. Pat. No. 6,147,825 to Alini et al. describes using an offset current to vary the reference voltage to which the capacitor voltage is compared to compensate for temperature variations. These conventional timer circuits are not desirable for several reasons. First, they often require adjustments (such as trimming) to attain acceptable accuracy. Second, the timer circuits are complex and are not desirable in some applications.

SUMMARY OF THE INVENTION

According to one embodiment of the present invention, a timer circuit includes a current mirror, a capacitor, a first switch, a resistor and a comparator. The current mirror receives a reference current as an input current and provides a first output current on a first output node and a second output current on a second output node where the second output current is N times the first output current. The capacitor is coupled between the first output node and a first power supply voltage where the capacitor receives the first output current when being charged. The first switch is coupled between the first output node and the first power supply voltage and is controlled by a first control signal to be in a first position for discharging the capacitor to the first power supply voltage and a second position to allow the capacitor to be charged by the first output current. The resistor is coupled between the second output node and the first power supply voltage where the resistor is biased by the second output current. The comparator has a first input terminal coupled to the first output node and a second input terminal coupled to the second output node. The comparator provides an output signal having a first state when the voltage across the capacitor at the first output node is less than the voltage across the resistor at the second output node and provides an output signal having a second state when the voltage across the capacitor at the first output node is equal to or greater than the voltage across the resistor at the second output node.

In one embodiment, the first control signal is deasserted to cause the first switch to be in the first position to discharge the capacitor and the first control signal is asserted to cause the first switch to be in the second position to allow the capacitor to be charged by the first output current, thereby initiating a predetermined time duration. Accordingly, the voltage across the capacitor increases as the capacitor is being charged by the first output current and the output signal of the comparator is triggered from the first state to the second state when the voltage across the capacitor reaches the voltage across the resistor. The timer circuit provides the predetermined time duration from the assertion of the first control signal to the triggering of the output signal of the comparator.

In another embodiment, a timer circuit is formed in an integrated circuit and includes a current mirror, a capacitor, a first switch, a comparator, an open pin detector circuit, a pin to which a resistor can be coupled to generate a first reference voltage, and a voltage reference circuit providing a second reference voltage. The open pin detector circuit detects the presence or absence of a resistor at the pin and automatically selects one of the first and second reference voltages to be used as the comparison reference voltage at the comparator.

According to another aspect of the present invention, a method for providing a time duration from the assertion of a first control signal including generating a first current and a second current by mirroring a reference current where the second current is N times the first current, coupling the first current to a capacitor, coupling the second current to a resistor, charging the capacitor to a first voltage when the first control signal is deasserted, changing the voltage across the capacitor using the first current when the first control signal is asserted, comparing a voltage across the capacitor to a voltage across the resistor, and triggering an output signal when the voltage across the capacitor is equal to the voltage across the resistor. The time duration provided is the time between the assertion of the first control signal and the triggering of the output signal. The voltage across the capacitor can be changed by either charging a previously discharged capacitor or discharging a previously precharged capacitor using the first current. Thus, the charging time constant or the discharging time constant establishes the time duration.

According to another aspect of the present invention, a timer circuit includes a current mirror, a capacitor, a first switch, a resistor and a comparator. The current mirror receives a reference current as an input current and provides a first output current on a first output node and a second output current on a second output node where the second output current is N times the first output current. The capacitor is coupled between the first output node and a ground voltage and receives the first output current as a sinking current. The first switch is coupled between a positive power supply voltage and the first output node where the first switch is controlled by a first control signal to be in a first position for precharging the capacitor to the positive power supply voltage and in a second position to allow the capacitor to be discharged by the first output current. The resistor is coupled between the second output node and the ground voltage where the resistor is biased by the second output current to develop a reference voltage across the resistor. The comparator has a first input terminal coupled to the first output node and a second input terminal coupled to the second output node. The comparator provides an output signal having a first state when the voltage across the capacitor at the first output node is greater than the reference voltage and provides an output signal having a second state when the voltage across the capacitor is equal to or less than the reference voltage.

According to yet another aspect of the present invention, a timer circuit includes a current mirror, a capacitor, a first switch, a resistor and a comparator. The current mirror receives a reference current as an input current and provides a first output current on a first output node and a second output current on a second output node where the second output current is N times the first output current. The capacitor is coupled between a positive power supply voltage and the first output node and receives the first output current as a sourcing current. The first switch is coupled between the first output node and a ground voltage where the first switch is controlled by a first control signal to be in a first position for precharging the capacitor to the positive power supply voltage and in a second position to allow the capacitor to be discharged by the first output current. The resistor is coupled between the second output node and the positive power supply voltage where the resistor is biased by the second output current to develop a reference voltage across the resistor. The comparator has a first input terminal coupled to the first output node and a second input terminal coupled to the second output node. The comparator provides an output signal having a first state when the voltage across the capacitor at the first output node is greater than the reference voltage and provides an output signal having a second state when the voltage across the capacitor is equal to or less than the reference voltage.

The present invention is better understood upon consideration of the detailed description below and the accompanying drawings.

DETAILED DESCRIPTION OF THE PREFERRED EMBODIMENTS

In accordance with the principles of the present invention, a timer circuit uses an adaptive reference voltage which operates to compensate for variations in the charging current of a capacitor so that an accurate time duration can be consistently provided by the timer circuit even when the charging current is subject to large variations. In one embodiment, the timer circuit receives a reference current and the timer circuit includes a reference capacitor charged by a charging current to develop a charging voltage and a reference resistor biased by a bias current to provide a reference voltage. The output of the timer circuit is asserted when the charging voltage reaches the reference voltage. The charging current and the bias current are derived from the reference current so that variations in the reference current are reflected to the same degree in the charging current and the bias current. Thus, the reference voltage varies in a manner so as to track variations in the charging voltage of the capacitor caused by variations in the charging current so that an accurate time duration can be consistently provided by the timer circuit regardless of the variations in the reference current from which the charging current is derived.

It is understood that the typical fabrication process yields a reference current that can vary +/−50% from the typical value due to variations in the operating conditions (temperature or voltage) and processing conditions. Trimming is usually required to improve the accuracy of the reference current. A main advantage of the timer circuit of the present invention is that the timer circuit provides a time duration that is insensitive to variations in the reference current used to generate the time duration. Thus, no trimming of the reference current is required and the timer circuit operation remains stable over large variations of the reference current to provide a highly accurate time duration.

According to another aspect of the present invention, the timer circuit includes a mode selection circuit to allow the timer circuit to select between one of two reference voltages to be used for comparison against the charging voltage. In one embodiment, the timer circuit includes an internal reference voltage and a device pin where a discrete resistor can be connected. The discrete resistor is biased by the bias current to generate the adaptive reference voltage. As thus configured, the user of the timer circuit can coupled a discrete resistor of the appropriate resistance to program a desired time duration for the timer circuit. The mode selection circuit will operate automatically to select the adaptive reference voltage when a resistor is coupled to the device pin and to select the internal reference voltage when no component is coupled to the device pin. The internal reference voltage can be a reference voltage generated in the conventional manner or an adaptive reference voltage of a fixed voltage magnitude.

Figure 1:
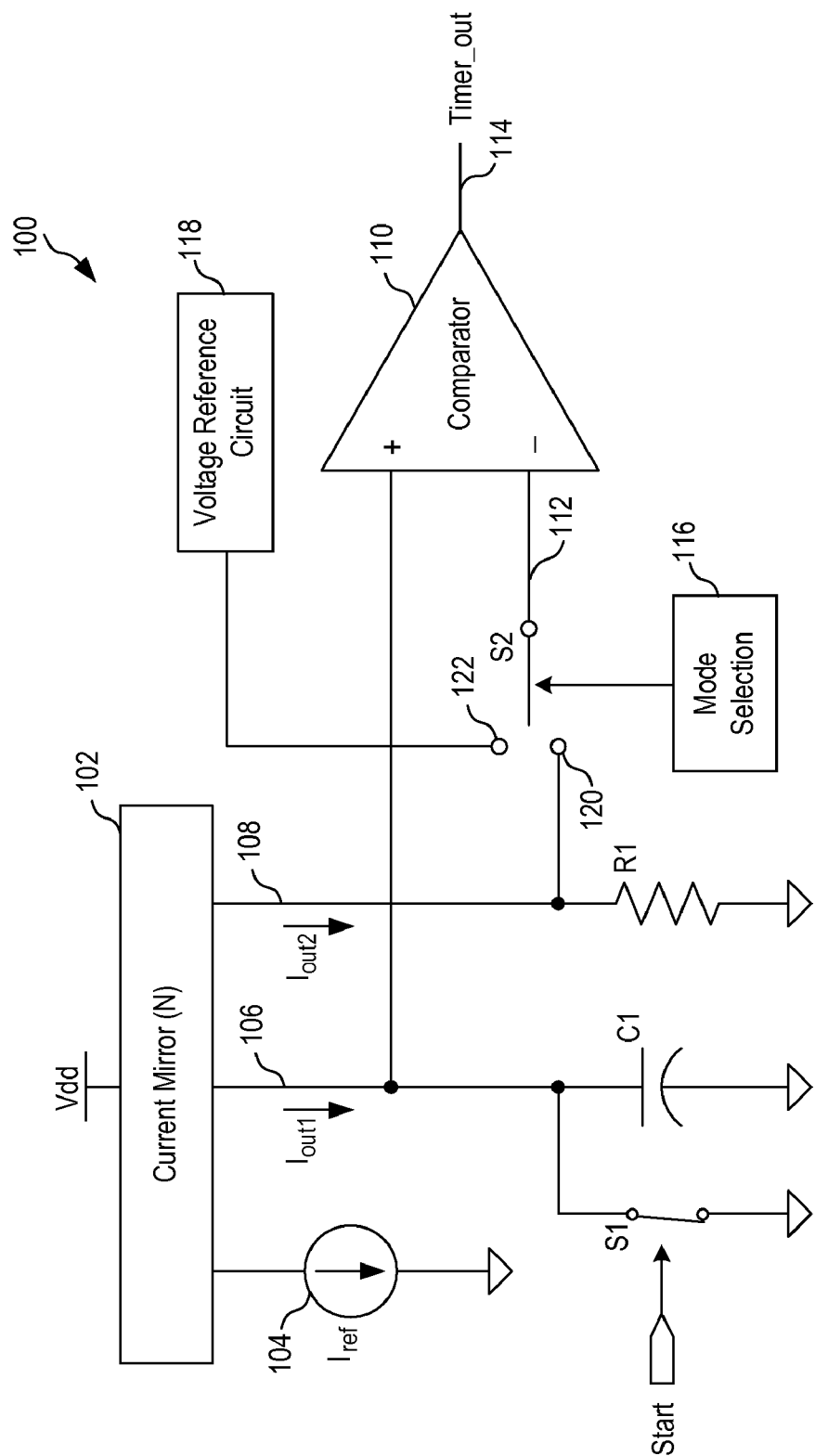
FIG. 1 is circuit diagram of a timer circuit using an adaptive reference voltage according to one embodiment of the present invention.

FIG. 1 is circuit diagram of a timer circuit using an adaptive reference voltage according to one embodiment of the present invention. Referring to FIG. 1, timer circuit 100 includes a current mirror 102 receiving a reference current Iref as the input current. In FIG. 1, reference current Iref is illustrated as being provided by a current source 104. Current source 104 is illustrative only. In actual implementation, timer circuit 100 usually receives the reference current from a source external to the timer circuit. Of course, a dedicated current source can also be used to generate the reference current for timer circuit 100. Current mirror 102 provides a first output current $I_{out1}$ on a lead 106 and a second output current $I_{out2}$ on a lead 108 having a predefined current ratio N. Thus, the relationship between the first output current $I_{out1}$ and the second output current $I_{out2}$ is given as:

$$N = \frac{I_{out2}}{I_{out1}}.$$

N can be any value less or greater than one. In most applications, N is greater than one and current $I_{out2}$ is greater than current $I_{out1}$. In practice, the current ratio N typically does not exceed 5. It is desirable to keep current $I_{out2}$ greater than current $I_{out1}$ so that the resistance value of resistor R1 and the capacitance value of capacitor C1 can be kept to reasonable values. If current $I_{out2}$ is less than current $I_{out1}$, a large resistor may be needed to preserve the same reference voltage value.

In timer circuit 100, first output current $I_{out1}$ of current mirror 102 is used as the charging current for a capacitor C1 while second output current $I_{out2}$ is used as the biasing current for a resistor R1. When current $I_{out1}$ is applied to charge capacitor C1, a charging voltage is developed across capacitor C1. A switch S1 is coupled between lead 106 (top plate of capacitor C1) and the ground node and is controlled by a Start signal. In operation, the Start signal is normally deasserted and switch S1 is normally closed to discharge capacitor C1 to ground. When the Start signal is asserted to initiate the predetermined time duration, switch S1 is open and capacitor C1 is charged by current $I_{out1}$. Switch S1 is closed again to discharge capacitor C1 when the timer circuit is to be reset in preparation for the next charging cycle to generate the desired time duration.

Current $I_{out2}$ is applied to bias resistor R1 to generate a reference voltage which is an adaptive reference voltage. That is, the reference voltage generated by resistor R1 will vary in response to variations in the reference current Iref so that the time duration to be generated remains constant despite variations in the reference current used to derive the charging current for charging capacitor C1. In the present embodiment, current $I_{out2}$ is applied to bias resistor R1 on a continuous basis so that the reference voltage on lead 108 is continuously available. In timer circuit 100, the time it takes for the charging voltage of capacitor C1 to reach the reference voltage of resistor R1 is the predetermined time duration of interest.

In timer circuit 100, a differential comparator 110 is used to compare the charging voltage and the reference voltage. The charging voltage of capacitor C1 (at lead 106) is coupled to the positive input terminal of comparator 110 while the reference voltage of resistor R1 is coupled to the negative input terminal of comparator 110. Comparator 110 compares the charging voltage on the positive input terminal to the reference voltage on the negative input terminal and provides a timer_out signal on lead 114 as output signal. In the present embodiment, the timer_out signal is normally at a logical low value when the charging voltage of capacitor C1 is less than the reference voltage. The timer_out signal switches to a logical high value when the charging voltage of capacitor C1 reaches the reference voltage.

In the present embodiment, timer circuit 100 is configured as a dual-mode timer circuit where the timer circuit can be operated using the adaptive reference voltage or using a secondary reference voltage generated by a voltage reference circuit 118. Thus, timer circuit 100 includes a switch S2 being controlled by an output signal of a mode selection circuit 116. Mode selection circuit 116 asserts its output signal to cause switch S2 to be in a first position (node 120) to select the adaptive reference voltage generated by the application of bias current $I_{out2}$ to resistor R1. Mode selection circuit 116 deasserts its output signal to cause switch S2 to be in a second position (node 122) to select the secondary reference voltage provided by voltage reference circuit 118. In one embodiment, voltage reference circuit 118 generates the secondary reference voltage in a conventional manner. For example, voltage reference circuit 118 can be a bandgap reference circuit providing the secondary reference voltage based on the 1.24 volts bandgap voltage. Of course, when the secondary reference voltage is selected instead of the adaptive reference voltage, the time duration provided by timer circuit 100 may not exhibit the current-variation-independent characteristics that are associated with the use of the adaptive reference voltage.

Mode selection circuit 116 can be implemented in different fashions depending on the applications to select between the use of the adaptive reference voltage or the secondary reference voltage. In one embodiment, the mode selection circuit is a user-selectable circuit allowing a user to select between the adaptive reference voltage and the conventional reference voltage. In another embodiment, mode selection circuit 116 is implemented as an open pin detector circuit for detecting the presence or absence of resistor R1. The open pin detector thus facilitates automatic mode selection. When resistor R1 is present, mode selection circuit 116 causes switch S2 to be in the first position (node 120) to select the adaptive reference voltage where the adaptive reference voltage is connected to the negative input terminal of comparator 110. When resistor R1 is absent, mode selection circuit 116 causes switch S2 to be in the second position (node 122) to select the secondary reference voltage where the secondary reference voltage is connected to the negative input terminal of comparator 110. The open pin detector circuit thus enables automatic selection of the desired reference voltage. Resistor R1 can then be an optional component of the timer circuit allowing the user of the timer circuit to include a resistor to the timer circuit when highly accurate time duration is desired and leave out the resistor when timing accuracy is not critical. When a resistor is not included, the timer circuit will automatically operate in a conventional manner.

The dual-mode implementation of timer circuit 100 in FIG. 1 is illustrative only. Switch S2, mode selection circuit 116 and voltage reference circuit 118 are all optional components of timer circuit 100 can be omitted when the dual-mode function is not desired. Thus, timer circuit 100 can be implemented by connecting the adaptive reference voltage of resistor R1 (lead 108) directly to the negative input terminal of comparator 110.

In the present embodiment, resistor R1 is a discrete resistor formed external to the integrated circuit on which the timer circuit is formed. Resistor R1 is therefore coupled to timer circuit 100 through a device pin of the timer circuit integrated circuit. An advantage of using a discrete resistor is that discrete resistors typically have tighter tolerance without trimming (such as about 1%) and negligible temperature coefficient as compared to resistors formed integrated in an integrated circuit. Because discrete resistors have small and negligible temperature coefficient as compared to integrated resistors, using discrete resistors eliminates the necessity of compensating for the temperature coefficient of the resistors, as is often required of integrated resistors. In one embodiment, resistor R1 is a high-precision discrete resistor with tolerance from 0.5% to 1%.

Another advantage of using a discrete resistor external to the timer circuit integrated circuit is that the time duration provided by the timer circuit can be programmable. As will be explained in more detail below, the time duration provided by timer circuit 100 is a function of the resistance of resistor R1. Thus, by using resistor R1 having the desired resistance value, a specific time duration for the timer circuit can be selected.

By using a discrete resistor and the adaptive reference voltage in accordance with the present invention, a highly accurate time duration can be achieved even when the reference current supplying the timer circuit has large variations. Typically, the reference current generated by a current source in an integrated circuit has large variations as a result of the variations in the fabrication process conditions and trimming has to be performed on the integrated circuit to modify the final reference current value to be within the desired range. However, in accordance with the present invention, an adaptive reference voltage is used to account for the variations in the reference current values and thus no trimming is required of the reference current source used to supply the timer circuit of the present invention. Eliminating the need for trimming reduces manufacturing cost and simplifies the manufacturing process.

While using discrete resistors provides unique advantages as described above, resistor R1 of the timer circuit of the present invention is not limited to discrete resistors but may be implemented using integrated resistors having the required characteristics. As semiconductor technology develops, it may be possible to fabricate an integrated resistor having tight tolerance (negligibly small resistance variation) and negligibly small temperature coefficient. In that case, such an integrated resistor can be used to implement resistor R1 of the timer circuit of the present invention.

In the present description, a discrete resistor refers to a resistor that is formed separate from the semiconductor substrate on which the timer circuit is formed. The discrete resistor is therefore an external component to the integrated circuit on which the timer circuit is formed. However, in some situations, the resistor may be packaged within the same housing as the timer circuit, as in the chip-on-chip packaging technology.

The operation of timer circuit 100 is as follows. The Start signal is deasserted to close switch S1 to cause capacitor C1 to be shorted to ground until timer circuit 100 is ready to start the time duration. When timer circuit 100 is to be initiated, the Start signal is asserted to open switch S1. Capacitor C1 is not longer shorted to ground but instead is being charged by charging current $I_{out1}$ from current mirror 102. Meanwhile, the bias current $I_{out2}$ applied to resistor R1 generates the adaptive reference voltage across resistor R1. The charging voltage of capacitor C1 continues to increase linearly and when the charging voltage reaches the voltage value of the adaptive reference voltage, comparator 110 triggers the timer_out signal and timer_out signal switches from a logical low state to a logical high state. The time duration between the assertion of the Start signal and the triggering of the timer_out signal is the desired time duration for timer circuit 100.

By using current mirror 102, the same reference current Iref is used to derive the charging current and the biasing current. Therefore, any variations in the reference current Iref, such as those caused by process variations, are reflected to the same degree in the first output current $I_{out1}$ and the second output current $I_{out2}$. In this manner, the reference voltage of timer circuit 100 tracks variations in the charging voltage due to variations in the reference current. Thus, the time duration provided by timer circuit 100 remains constant despite variations in the reference current resulting in variations in the charging voltage of capacitor C1. In conventional timer circuits, the reference voltage can be generated independent of the current used to charge the capacitor. Therefore, the reference voltage does not track variations in charging voltage of the capacitor caused by variations in the charging current. When the reference voltage remains constant or varies in a different manner as compared to the variations in the charging voltage, the time duration thus established can have large variations and thus large inaccuracies. The timer circuit of the present invention overcomes the shortcomings of the conventional timer circuits by using adaptive reference voltage that tracks the variations in the reference current used to generate the charging voltage.

Figure 2:
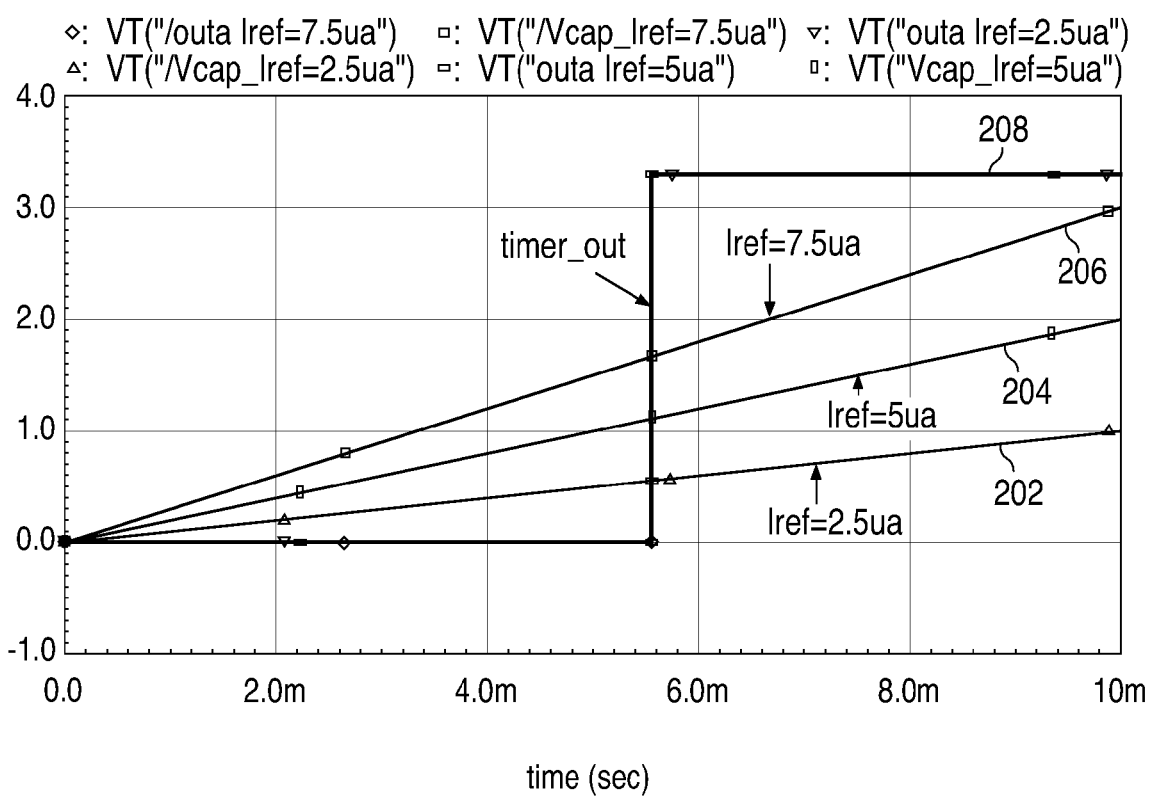
FIG. 2 includes simulation waveforms illustrating the charging voltage of capacitor C1 and the comparator output signal timer_out versus time characteristics of the timer circuit of the present invention for different values of the reference current Iref.

FIG. 2 includes simulation waveforms illustrating the charging voltage of capacitor C1 and the comparator output signal timer_out versus time characteristics of the timer circuit of the present invention for different values of the reference current Iref. Referring to FIG. 2, curves 202, 204 and 206 illustrate the behavior of the charging voltage of capacitor C1 as the reference current Iref varies from 2.5 µA, to 5 µA, to 7.5 µA, respectively. Curve 208 illustrates the timer_out signal of the comparator. The timer_out signal (curve 208) is normally at a logical low and switches to a logical high value at a time of about 5.6 ms when the charging voltage of capacitor C1 has increased up to the value of the adaptive reference voltage. As shown in FIG. 2, the triggering time of the timer_out signal, that is, the time when the signal transitions from a logical low to a logical high, does not change even when the reference current value varies over 200%. Thus, the timer circuit of the present invention employing an adaptive reference voltage can generate a highly accurate time duration despite variations in the reference current used to bias the timer circuit.

The time duration "$T_d$" established by timer circuit 100 can be described as follows. First, the time duration is related to the capacitance of capacitor C1, the reference voltage value and the charging current $I_{out1}$ as follows:

$$T_d = \frac{C1 \times Vref}{I_{out1}},$$

where C1 denotes the capacitance of capacitor C1 and Vref denotes the reference voltage generated by resistor R1. The reference voltage Vref is given by:

$$Vref = I_{out2} \times R1,$$

where R1 denotes the resistance of resistor R1. By substituting the equation for the reference voltage Vref into the equation for the time duration $T_d$ above, the time duration can be expressed as:

$$T_d = \frac{C1 \times R1 \times I_{out2}}{I_{out1}}.$$

As described above, the charging current $I_{out1}$ and the bias current $I_{out2}$ are related to each other through the current ratio N as:

$$N = \frac{I_{out2}}{I_{out1}}.$$

Thus, by substituting N for the ratio of $I_{out2}$ to $I_{out1}$, the time duration $T_d$ can be simplified to:

$$T_d = C1 \times R1 \times N.$$

Therefore, in the timer circuit of the present invention, the time duration provided by the timer circuit is the product of the capacitance of the charging capacitor, the resistance of the resistor and the current ratio of the current mirror. Integrated resistors might have tolerances (or resistance variations) up to 10 times more than the tolerances of integrated capacitors. Therefore, the resistance of the resistor has the dominant contribution to the variations of the time duration generated by the timer circuit.

Figure 3B:
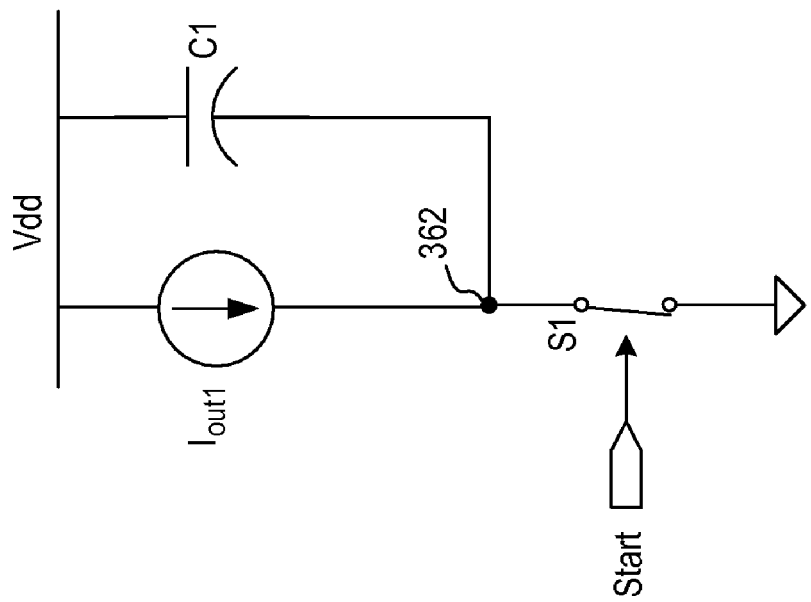
FIGS. 3A and 3B illustrate two exemplary configurations of capacitor C1 and switch S1 for implementing a discharge operation in the timer circuit of the present invention.
Figure 3A:
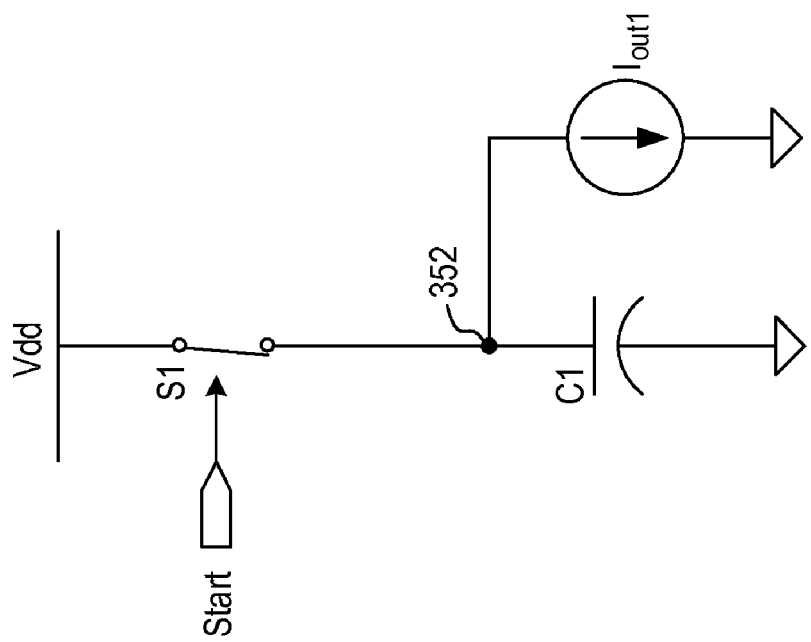

In the above described embodiment, the time duration of the timer circuit is generated by the charging of capacitor C1. It is understood that the same time duration can be generated by discharging a precharged capacitor C1. One of ordinary skill in the art would appreciate that the arrangement of capacitor C1 and switch S1 can be altered appropriately to utilize the discharging time of capacitor C1 to establish the predetermined time duration. FIGS. 3A and 3B illustrate two exemplary configurations of capacitor C1 and switch S1 for implementing a discharge operation in the timer circuit of the present invention. The capacitor and switch circuit of each of FIGS. 3A and 3B can be appropriately incorporated in the timer circuit of FIG. 1 for triggering a timer_out signal a predetermined time duration from the assertion of the Start signal where the time duration is established by the discharge time constant of capacitor C1.

Referring to FIG. 3A, switch S1 and capacitor C1 are coupled in series between the positive supply voltage (Vdd) and the ground node. In the present illustration, current $I_{out1}$ from the current mirror is a sinking current coupled to node 352 which is the top plate of capacitor C1. Current $I_{out1}$ is denoted by a current sink connected between node 352 and the ground node. It is understood that the current sink is symbolic only and in actual implementation, the current mirror (FIG. 1) provides the sinking current $I_{out1}$ which is coupled to the top plate of capacitor C1. In the configuration shown in FIG. 3A, switch S1 is normally closed when the timer circuit is not enabled and the Start signal is deasserted. Capacitor C1 is then precharged to the Vdd voltage. The comparator will now have a normally high logical state as the capacitor voltage is greater than the reference voltage. When the Start signal is asserted to initiate the predetermined time duration, switch S1 is open and capacitor C1 is no longer charged by the Vdd voltage. Instead, capacitor C1 is discharged to ground by sinking current $I_{out1}$. The discharging of capacitor C1 causes the voltage across the capacitor to decrease linearly. When the capacitor voltage decreases to below the reference voltage provided by resistor R1, the comparator output signal timer_out is triggered and transitions to a logical low. When the timer circuit is reset, the Start signal is deasserted to open switch S1 and capacitor C1 is precharged again.

In an alternate implementation of the discharge scheme (FIG. 3B), capacitor C1 has a top plate connected to the Vdd voltage and a bottom plate coupled to a node 362. Switch S1 is coupled between the bottom plate (node 362) of capacitor C1 and the ground node. A sourcing current $I_{out1}$ is coupled to the bottom plate of capacitor C1 and is illustrated as a current source between the Vdd voltage and node 362. In the configuration shown in FIG. 3B, switch S1 is normally closed to precharge capacitor C1 to the Vdd voltage. When the Start signal is asserted to initiate the predetermined time duration, switch S1 is open and capacitor C1 is discharged to Vdd by sourcing current $I_{out1}$. Specifically, sourcing current $I_{out1}$ charges up the bottom plate of capacitor C1 so that the voltage across the capacitor decreases linearly. When the capacitor voltage decreases to below the reference voltage provided by resistor R1, the comparator output signal timer_out is triggered and transitions to a logical low.

It is well understood in the art that both the charging time constant and the discharging time constant of a capacitor can be used to generate the desired time duration in the timer circuit. The critical feature of the timer circuit of the present invention is the use of the adaptive reference voltage for comparison to the capacitor voltage, whether charging or discharging, so that variations in the capacitor voltage caused by variations in the reference current supplied to the timer circuit are compensated for. Furthermore, it is well understood that other configurations of the charging and discharging operations can be used without departing from the spirit of the present invention. That is, different arrangements of the charging capacitor, the charging/discharging current and the switch can be used to generate an increasing or decreasing voltage across the capacitor so that the charging or discharging time constant can be used to establish a desired time duration. The embodiments shown in FIGS. 1, 3A and 3B are illustrative only and are not intended to be limiting. Regardless of the actual implementation of the charging and discharging operation, an accurate time duration can be generated by the timer circuit of the present invention by using the adaptive reference voltage where the adaptive reference voltage is generated by reflecting the same reference current used to derive the charging or discharging current.

Figure 4:
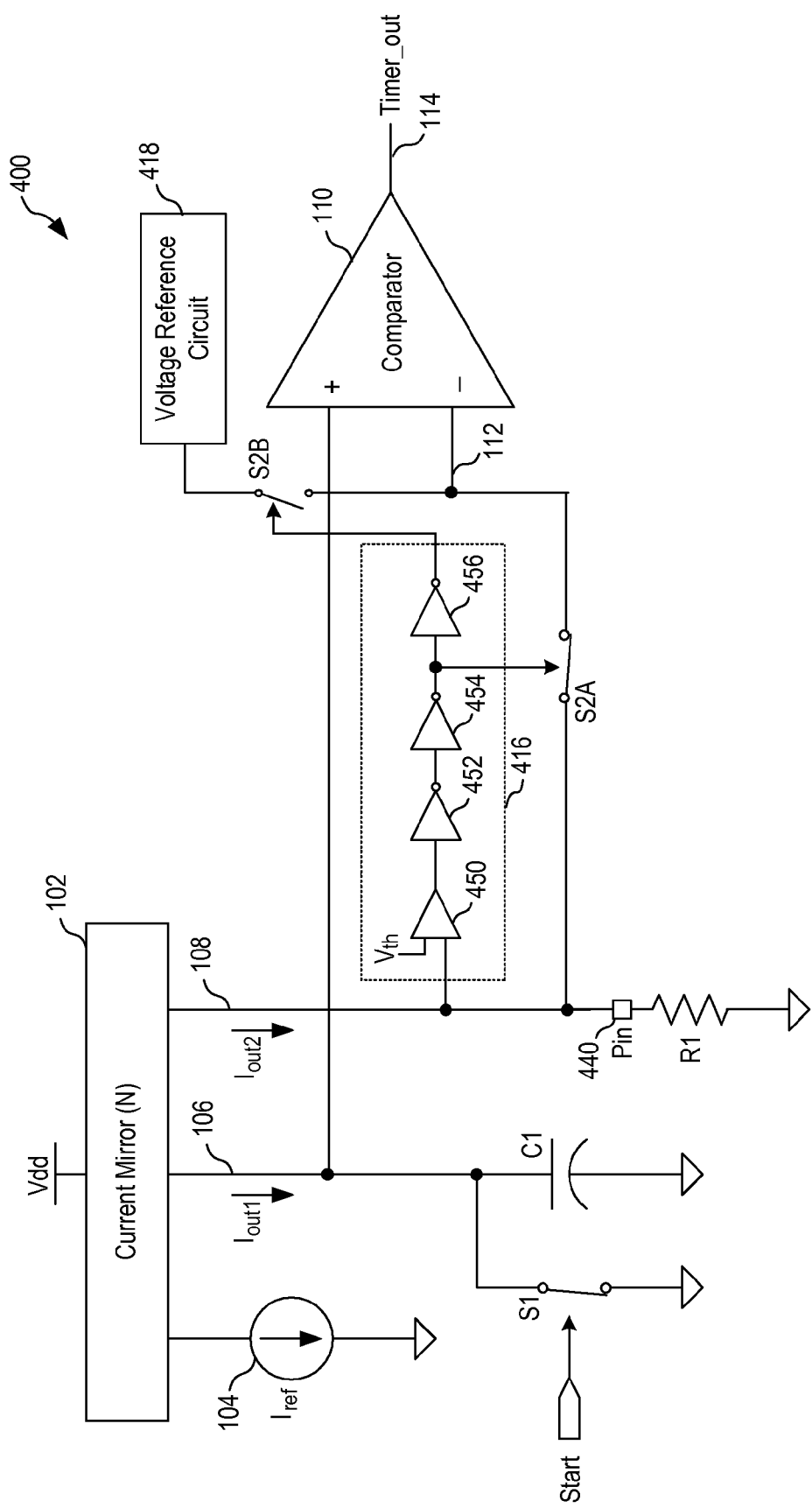
FIG. 4 is a circuit diagram of a timer circuit using an adaptive reference voltage and incorporating a pin detection circuit as the mode selection circuit according to an alternate embodiment of the present invention.

FIG. 4 is a circuit diagram of a timer circuit using an adaptive reference voltage and incorporating a pin detection circuit as the mode selection circuit according to an alternate embodiment of the present invention. Like elements in FIGS. 1 and 4 are given like reference numerals to simplify the discussion. Referring to FIG. 4, timer circuit 400 is configured in the same manner as timer circuit 100 of FIG. 1 where the charging of capacitor C1 by current $I_{out1}$ provides a charging voltage on node 106 to compare with an adaptive reference voltage on node 108 to generate the timer_out signal. The adaptive reference voltage has a value of $I_{out2}*R1$ when resistor R1 is coupled to timer circuit 400, as will be explained in more detail below.

In the embodiment shown in FIG. 4, all components of timer circuit 400 are formed on a single integrated circuit except for resistor R1. Resistor R1 is thus an external or discrete resistor coupled to a device pin 440 of the integrated circuit on which the timer circuit is formed. It is well understood that a device pin is formed an integrated circuit to provide input/output connection for external components to the integrated circuit. Resistor R1 is thus optional and can be included or excluded depending on the application. Furthermore, by using an external resistor, the time duration provided by the timer circuit is thus programmable as a resistor having the appropriate resistance value can be used to establish the desired time duration.

Timer circuit 400 includes an open pin detector circuit 416 as the mode selection circuit for detecting the presence or absence of resistor R1 at pin 440 and automatically selecting either the internal reference voltage or the adaptive reference voltage in response to the absence or presence of the resistor. In the present illustration, the internal voltage reference is generated by a voltage reference circuit 418 and can be either a conventional reference voltage or a second adaptive reference voltage, as will be explained in more detail below.

In timer circuit 400, switches S2A and S2B implement the function of switch S2 in FIG. 1. Open pin detector circuit 416, together with switches S2A and S2B, realizes the automatic reference voltage selection operation of the timer circuit. In the present embodiment, open pin detector circuit 416 includes a comparator 450 having a first input terminal coupled to pin 440 (which is electrically equivalent to node 108) and a second input terminal coupled to a threshold voltage $V_{th}$. Comparator 450 monitors the voltage on pin 440 to determine if a resistor has been connected to the pin. When a resistor R1 is coupled to pin 440 between pin 440 and the ground node, current $I_{out2}$ passes through the resistor and a voltage value of $I_{out2}*R1$ develops at pin 440. When no resistor is coupled to pin 440 and the pin is thus an open pin, pin 440 will have a voltage very near the positive power supply voltage Vdd. By comparing the voltage at pin 440 to the threshold voltage $V_{th}$, comparator 450 operates to determine the voltage value at pin 440 and to provide an output signal indicating the presence or absence of a resistor at the pin.

Threshold voltage $V_{th}$ coupled to comparator 450 should have a value that is greater than the maximum voltage value ($I_{out2}*R1$) expected at pin 440 when a resistor is connected and less than the Vdd voltage. In this manner, when a resistor R1 is coupled to pin 440, the voltage at pin 440 will be less than the threshold voltage value and comparator 450 will provide an output signal having a first logical state (such as logical "lo"). When no resistor is coupled to pin 440, the voltage at pin 440 will be near or equal to the Vdd voltage and is thus greater than the threshold voltage value. Comparator 450 will then provide an output signal having a second logical state (such as logical "hi").

The output terminal of comparator 450 is coupled to a string of serially connected inverters 452, 454 and 456. Inverters 452, 454 and 456 operate to amplify the output signal of comparator 450. Inverter 454 provides a first output signal for driving switch S2A while inverter 456 provides a second output signal, being opposite in polarity to the first output signal, for driving switch S2B. Switches S2A and S2B are driven by control signals having opposite polarities so that only one of the two switches are closed at a time. In the present embodiment, switches S2A and S2B are active low switches and are closed when the control signal is at a logical low and are open when the control signal is at a logical high.

The operation of the open pin detector circuit 416 is as follows. When a resistor R1 is connected to pin 440, open pin detector circuit 416 will sense a voltage less than threshold voltage $V_{th}$ on the first input terminal of comparator 450. Comparator 450 thus generates an output signal having a logical low state. The output signal will be amplified to a logical high signal by inverter 452 and inverted by inverter 454. The logical low output signal of inverter 454 thus drives switch S2A, causing the switch to close. At the same time, inverter 456 inverts the logical low output signal of inverter 454 and the logical high output signal of inverter 456 is coupled to drive switch S2B, causing the switch to open. In this manner, open pin detector circuit 416 detects the presence of a resistor at pin 440 and closes switch S2A to allow the adaptive reference voltage $I_{out2}*R1$ to be coupled to the negative input terminal 112 of comparator 110. Meanwhile, switch S2B is open so that the internal reference voltage of voltage reference circuit 418 is disengaged from terminal 112.

Alternately, when no resistor is coupled to timer circuit 400 and pin 440 is an open pin, open pin detector circuit 416 will sense a Vdd voltage or near Vdd voltage greater than the threshold voltage $V_{th}$ on the first input terminal of comparator 450. Comparator 450 thus generates an output signal having a logical high state. The output signal will be amplified to a logical low signal by inverter 452 and inverted by inverter 454. The logical high output signal of inverter 454 thus drives switch S2A, causing the switch to open. At the same time, inverter 456 inverts the logical high output signal of inverter 454 and the logical low output signal of inverter 456 is coupled to drive switch S2B, causing the switch to close. In this manner, open pin detector circuit 416 detects the absence of a resistor at pin 440 and opens switch S2A so that the voltage at pin 440 is disengaged from the negative input terminal 112 of comparator 110. Meanwhile, switch S2B is closed so that the internal reference voltage of voltage reference circuit 418 is coupled to the negative input terminal 112 of comparator 110 to be used as the comparator reference voltage.

In the above described embodiment, a string of three inverters 452, 454 and 456 is used to amplify and invert the comparator output signal of comparator 450. One of ordinary skill in the art would appreciate that using inverters 452, 454 and 456 in open pin detector circuit 416 is illustrative only and other combinations of inverting and/or non-inverting buffers can be used to implement amplification and inversion functions to provide two control signals having opposite polarities. For instance, inverters 452 and 454 can be formed as an non-inverting buffer.

As described above, the internal reference voltage provided by voltage reference circuit 418 can be generated in a conventional manner and is therefore a non-adaptive reference voltage. Alternately, when an integrated resistor having tight tolerance and small temperature coefficient can be built, such an integrated resistor can be used by timer circuit 400 to generate an internal reference voltage that is also an adaptive reference voltage. In that case, current mirror 102 provides a third output current Iout3. The third output current Iout3 is used to bias the integrated resistor to provide a first adaptive reference voltage of a predetermined magnitude. The timer circuit thus provides a fixed time duration determined by the resistance of the integrated resistor. The timer circuit can thus operate by allowing the user to either couple a resistor R1 to pin 440 to program a desired time duration or to leave pin 440 open to use the predetermined fixed time duration provided by the integrated resistor. The open pin detector circuit will operate automatically to determine which adaptive reference voltage should be coupled to the comparator.

The above detailed descriptions are provided to illustrate specific embodiments of the present invention and are not intended to be limiting. Numerous modifications and variations within the scope of the present invention are possible. The present invention is defined by the appended claims.

We claim:

1. A timer circuit comprising:
   a current mirror receiving a reference current as an input current, the current mirror providing a first output current on a first output node and a second output current on a second output node, the second output current being N times the first output current;
   a capacitor coupled between the first output node and a ground voltage, the capacitor receiving the first output current as a sinking current;
   a first switch coupled between a positive power supply voltage and the first output node, the first switch being controlled by a first control signal to be in a first position for precharging the capacitor to the positive power supply voltage and in a second position to allow the capacitor to be discharged by the first output current;

a resistor coupled between the second output node and the ground voltage, the resistor being biased by the second output current to develop a reference voltage across the resistor; and a comparator having a first input terminal coupled to the first output node and a second input terminal coupled to the second output node, the comparator providing an output signal having a first state when the voltage across the capacitor at the first output node is greater than the reference voltage and providing an output signal having a second state when the voltage across the capacitor is equal to or less than the reference voltage.

2. The timer circuit of claim 1, wherein the first control signal is deasserted to cause the first switch to be in the first position to precharge the capacitor and the first control signal is asserted to cause the first switch to be in the second position to allow the capacitor to be discharged by the first output current, thereby initiating a predetermined time duration.

3. The timer circuit of claim 2, wherein upon assertion of the first control signal, the voltage across the capacitor decreases as the capacitor is being discharged by the first output current, the output signal of the comparator is triggered from the first state to the second state when the voltage across the capacitor decreases to the reference voltage, the timer circuit providing the predetermined time duration from the assertion of the first control signal to the triggering of the output signal of the comparator.

4. The timer circuit of claim 3, wherein the time duration is a product of the capacitance of the capacitor, the resistance of the resistor and N.

5. The timer circuit of claim 1, wherein N is greater than one.

6. The timer circuit of claim 1, wherein the timer circuit is built on an integrated circuit and the resistor is an integrated resistor built on the same integrated circuit, the integrated resistor having tight tolerance and negligible temperature coefficient.

7. The timer circuit of claim 1, wherein the timer circuit is built on an integrated circuit and the resistor comprises a discrete resistor external to the integrated circuit and being coupled to the integrated circuit to receive the second output current.

8. The timer circuit of claim 1, further comprising:
a reference voltage circuit for generating a second reference voltage; and
a second switch coupled to the second input terminal of the comparator and being controlled by a second control signal, the second switch being in a first position for connecting the reference voltage across the resistor to the second input terminal of the comparator and being in a second position for connecting the second reference voltage from the reference voltage circuit to the second input terminal of the comparator,
wherein the comparator receives either the reference voltage or the second reference voltage as a comparison reference voltage, the comparator providing an output signal having a first state when the voltage across the capacitor at the first output node is less than the comparison reference voltage and providing an output signal having a second state when the voltage across the capacitor is equal to or greater than the comparison reference voltage.

9. The timer circuit of claim 8, wherein the second control signal is generated by a circuit detecting the presence or absence of the resistor, the second control signal being asserted to cause the second switch to be in the first position when the resistor is present and the second control signal being deasserted to cause the second switch to be in the second position when the resistor is absent.

10. A timer circuit comprising:
a current mirror receiving a reference current as an input current, the current mirror providing a first output current on a first output node and a second output current on a second output node, the second output current being N times the first output current;
a capacitor coupled between a positive power supply voltage and the first output node, the capacitor receiving the first output current as a sourcing current;
a first switch coupled between the first output node and a ground voltage, the first switch being controlled by a first control signal to be in a first position for precharging the capacitor to the positive power supply voltage and in a second position to allow the capacitor to be discharged by the first output current;
a resistor coupled between the second output node and the positive power supply voltage, the resistor being biased by the second output current to develop a reference voltage across the resistor; and
a comparator having a first input terminal coupled to the first output node and a second input terminal coupled to the second output node, the comparator providing an output signal having a first state when the voltage across the capacitor at the first output node is greater than the reference voltage and providing an output signal having a second state when the voltage across the capacitor is equal to or less than the reference voltage.

11. The timer circuit of claim 10, wherein the first control signal is deasserted to cause the first switch to be in the first position to precharge the capacitor and the first control signal is asserted to cause the first switch to be in the second position to allow the capacitor to be discharged by the first output current, thereby initiating a predetermined time duration.

12. The timer circuit of claim 11, wherein upon assertion of the first control signal, the voltage across the capacitor decreases as the capacitor is being discharged by the first output current, the output signal of the comparator is triggered from the first state to the second state when the voltage across the capacitor decreases to the reference voltage, the timer circuit providing the predetermined time duration from the assertion of the first control signal to the triggering of the output signal of the comparator.

13. The timer circuit of claim 12, wherein the time duration is a product of the capacitance of the capacitor, the resistance of the resistor and N.

14. The timer circuit of claim 10, wherein N is greater than one.

15. The timer circuit of claim 10, wherein the timer circuit is built on an integrated circuit and the resistor is an integrated resistor built on the same integrated circuit, the integrated resistor having tight tolerance and negligible temperature coefficient.

16. The timer circuit of claim 10, wherein the timer circuit is built on an integrated circuit and the resistor comprises a discrete resistor external to the integrated circuit and being coupled to the integrated circuit to receive the second output current.

17. The timer circuit of claim 10, further comprising:
a reference voltage circuit for generating a second reference voltage; and a second switch coupled to the second input terminal of the comparator and being controlled by a second control signal, the second switch being in a first position for connecting the reference voltage across the resistor to the second input terminal of the comparator and being in a second position for connecting the second reference voltage from the reference voltage circuit to the second input terminal of the comparator, wherein the comparator receives either the reference voltage or the second reference voltage as a comparison reference voltage, the comparator providing an output signal having a first state when the voltage across the capacitor at the first output node is less than the comparison reference voltage and providing an output signal having a second state when the voltage across the capacitor is equal to or greater than the comparison reference voltage.

18. The timer circuit of claim 17, wherein the second control signal is generated by a circuit detecting the presence or absence of the resistor, the second control signal being asserted to cause the second switch to be in the first position when the resistor is present and the second control signal being deasserted to cause the second switch to be in the second position when the resistor is absent.

\* \* \* \* \*